(12) United States Patent
Davis et al.

(10) Patent No.: US 10,932,388 B1
(45) Date of Patent: Feb. 23, 2021

(54) PLUGGABLE POWER DISTRIBUTION UNITS FOR MODULAR EDGE POWER SYSTEMS

(71) Applicant: ABB Power Electronics Inc., Plano, TX (US)

(72) Inventors: Roy Davis, Rowlett, TX (US); Jeremy Miles, McKinney, TX (US); Donald Rearick, Rowlett, TX (US)

(73) Assignee: ABB Power Electronics Inc., Plano, TX (US)

(*) Notice: Subject to any disclaimer, the term of this patent is extended or adjusted under 35 U.S.C. 154(b) by 0 days.

(21) Appl. No.: 16/745,136

(22) Filed: Jan. 16, 2020

(51) Int. Cl.
  *H05K 7/14* (2006.01)
  *H01R 25/16* (2006.01)
  *G06F 1/18* (2006.01)

(52) U.S. Cl.
  CPC .......... *H05K 7/1492* (2013.01); *G06F 1/189* (2013.01); *H01R 25/161* (2013.01)

(58) Field of Classification Search
  CPC .............................. G06F 1/189; H05K 7/1492
  See application file for complete search history.

(56) References Cited

U.S. PATENT DOCUMENTS

| | | | |
|---|---|---|---|
| 6,421,259 B1 | 7/2002 | Brooks et al. | |
| 7,994,653 B2 | 8/2011 | Gibson et al. | |
| 9,276,474 B2* | 3/2016 | Meinecke | H02M 3/158 |
| 9,374,926 B1 | 6/2016 | Fontana | |
| 9,379,614 B2* | 6/2016 | Meinecke | H05K 7/183 |
| 9,466,954 B1* | 10/2016 | Stevens | G06F 1/189 |
| 9,698,577 B2* | 7/2017 | Yi | H05K 7/1492 |
| 9,723,742 B2* | 8/2017 | Steeves | G06F 1/189 |
| 9,986,658 B2* | 5/2018 | Sarti | H05K 7/1492 |
| 2014/0183977 A1 | 7/2014 | Braunstein | |
| 2018/0198247 A1* | 7/2018 | Klein | H02B 1/26 |
| 2019/0297749 A1* | 9/2019 | Bernardin | G06F 1/20 |
| 2020/0205309 A1* | 6/2020 | Rearick | H05K 7/1489 |

* cited by examiner

Primary Examiner — Robert J Hoffberg
(74) Attorney, Agent, or Firm — Barnes & Thornburg LLP

(57) ABSTRACT

A modular edge power system is provided. The modular edge power system includes a housing having a rack adapted to mount compute devices and a direct current power bus within the housing. Multiple power distribution units are adapted to be removably coupled to the direct current power bus at a position within the housing and outside of the rack. Each power distribution unit is configured to distribute electrical power received from the direct current power bus to one or more compute devices mounted in the rack. Each power distribution unit may convert the electrical power from a first power level to a second power level.

17 Claims, 16 Drawing Sheets

PLUGGABLE POWER DISTRIBUTION UNITS FOR MODULAR EDGE POWER SYSTEMS

TECHNICAL FIELD

The present disclosure relates to modular edge power systems and, more particularly, to pluggable power distribution units for such systems.

BACKGROUND

In typical data centers, such as those utilized in a cloud or edge architecture, compute devices (e.g., executing functions in virtualized environments, such as in virtual machines or containers, on behalf of client devices) are arranged in racks and power is delivered to each compute device in each rack by corresponding power electronics. Typical racks may include a direct current (DC) distribution panel located in one or more bays of the rack. Individual load equipment in the rack (e.g., servers or other compute devices) is often connected to the DC distribution panel with complicated cable arrangements.

SUMMARY OF THE INVENTION

According to one aspect of the present disclosure, a modular edge power system may comprise a housing having a rack adapted to mount compute devices and a direct current power bus within the housing. Multiple power distribution units may be adapted to be removably coupled to the direct current power bus at a position within the housing and outside of the rack. Each power distribution unit may be configured to distribute electrical power received from the direct current power bus to one or more compute devices mounted in the rack. Each power distribution unit may convert the electrical power from a first power level to a second power level.

In some embodiments, the first electrical power level may comprise 48 volts direct current.

In some embodiments, the power distribution circuit may also convert the first electrical power level to the second electrical power level. The first electrical power level may comprise direct current at a first voltage, and the second electrical power level may comprise direct current at a second voltage, where the second voltage is lower than the first voltage.

In some embodiments, the first voltage may comprise 48 volts direct current, and the second voltage may comprise 12 volts direct current or 24 volts direct current.

In some embodiments, the second electrical power level may comprise a low current direct current power level.

In some embodiments, the second electrical power level may comprise 100 amperes per compute device.

In some embodiments, the second electrical power level may comprise a high current direct current power level.

In some embodiments, the second electrical power level may comprise 250 amperes per compute device.

In some embodiments, the power distribution circuit may also convert the first electrical power level to the second electrical power level. The first electrical power level may comprise direct current, and the second electrical power level may comprise alternating current.

In some embodiments, the bus interface may comprise a plurality of sockets. Each socket may be adapted to receive a power pin of the direct current power bus.

In some embodiments, the bus interface further may comprise a slot adapted to receive a key of the direct current power bus. The key may be located in a predetermined position with a predetermined orientation relative to the plurality of sockets.

In some embodiments, the load equipment interface may comprise a plurality of connector receptacles, wherein each of the connector receptacles is adapted to receive a connector coupled to a compute device of the one or more compute devices.

In some embodiments, the power distribution unit may comprise a housing. The bus interface may be positioned on a first side of the housing, and the load equipment interface may be positioned on a second side of the housing.

In some embodiments, the power distribution circuit may comprise a circuit breaker accessible through an opening in the housing.

According to another aspect of the present disclosure, a modular edge power system may comprise a cabinet housing, a rack adapted to mount a plurality of compute devices within the cabinet housing, a direct current power bus within the cabinet housing, and a power distribution unit removably coupled to the direct current power bus and removably coupled to one or more compute devices in the rack. The power distribution unit may be configured to convert a first electrical power level received from the direct current power bus to a second electrical power level delivered to the one or more compute devices. The power distribution unit may be positioned within the cabinet housing and outside of the rack.

In some embodiments, the direct current power bus may comprise a plurality of power pins. The power distribution unit may comprise a plurality of sockets. Each socket may be adapted to receive a power pin of the direct current power bus.

In some embodiments, the plurality of power pins may comprise a first group of positive pins, a second group of positive pins, and a third group of common pins. The first group and the second group may be redundant. The plurality of sockets may comprise a first group of sockets that are each adapted to receive a power pin of the first group, a second group of sockets that are each adapted to receive a power pin of the second group, and a third group of sockets that are each adapted to receive a power pin of the common group.

In some embodiments, the direct current power bus may comprise a key located in a predetermined position with a predetermined orientation relative to the plurality of power pins. The power distribution unit may comprise a slot adapted to receive the key of the direct current power bus.

In some embodiments, the power distribution unit may further comprise a plurality of power distribution units removably coupled to the direct current power bus. Each power distribution unit may be removably coupled to a different one or more compute devices in the rack. Each power distribution unit may be configured to convert the first electrical power level to a second electrical power level that is associated with the corresponding one or more compute devices.

In some embodiments, the power distribution unit may further comprise an edge module adapted to be removably inserted into the cabinet housing outside of the rack and to provide the first electrical power level to the direct current power bus. The edge module may comprise a rectifier submodule and a battery submodule.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements. The detailed description particularly refers to the accompanying figures in which.

DETAILED DESCRIPTION OF THE DRAWINGS

Figure 1:
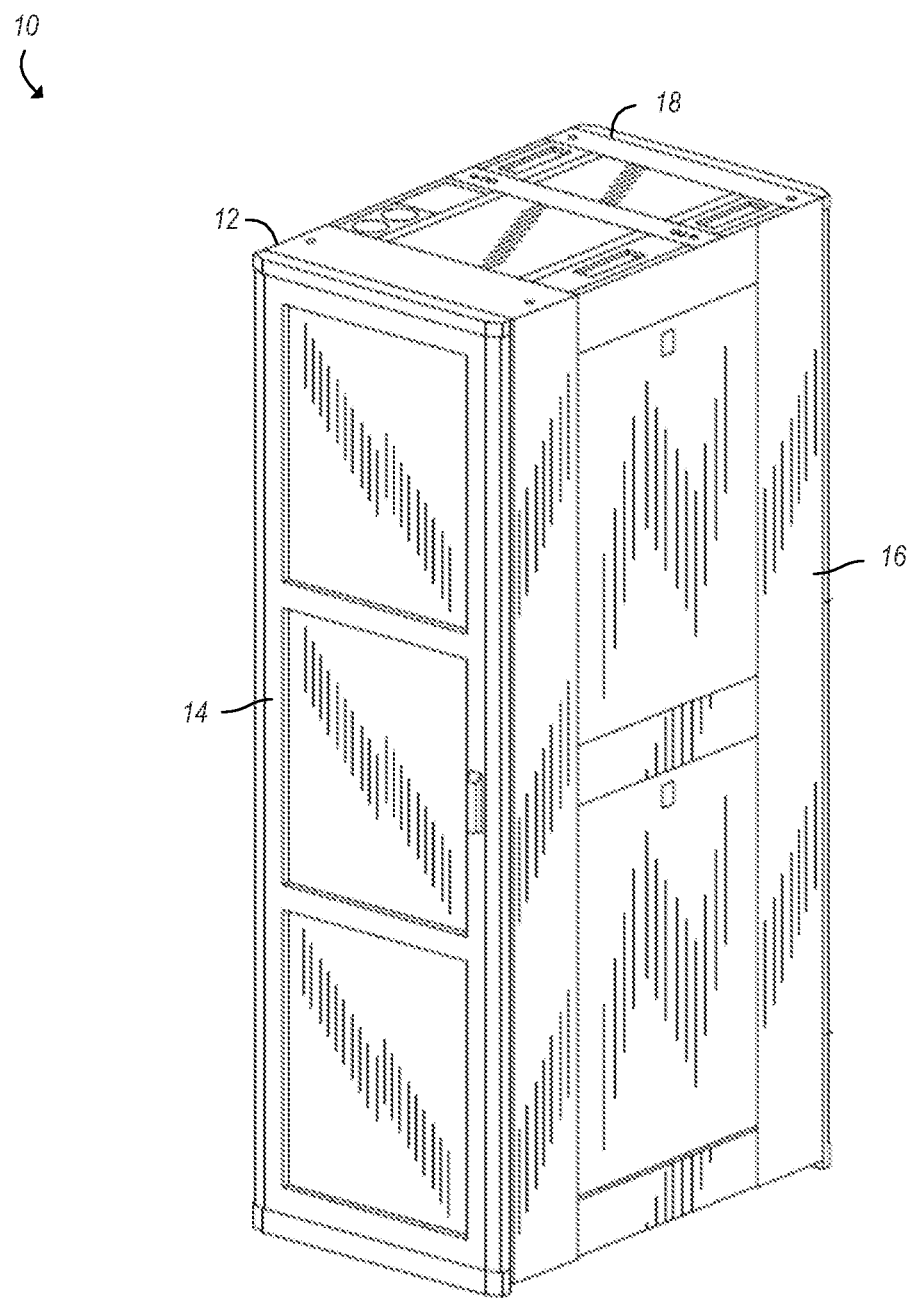
FIG. 1 shows a perspective view of the exterior of one illustrative embodiment of an integrated power cabinet with optional doors and side panels intact for use in a data center.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

The presently disclosed pluggable power distribution units (PDUs) house direct current (DC) power distribution equipment in a rear volume, outside of a rack that houses revenue generating equipment (e.g., compute devices or other load equipment), thereby maximizing cabinet space for revenue generating equipment. The pluggable PDUs also provide other benefits. For example, each PDU may be positioned on the DC power bus relatively near the load equipment, which may minimize wiring distance and/or gauge size and improve efficiency. The PDUs may facilitate installation, service, and repair of servers and power distribution elements. For example, individual PDUs may be installed and/or replaced without tools and while the cabinet is fully powered. As another example, circuit breakers, fuses, or other protective devices within the PDUs may be serviced and/or replaced without removing or replacing cables or other wiring. In addition, various PDUs with different power distribution characteristics may be installed in a single rack according to requirements of the load equipment. Further, the pluggable PDUs of the present disclosure may include smart features, such as controller communication, location monitoring, alarms, voltage monitoring, current monitoring, temperature monitoring, individual protector status, or other smart features.

Referring now to FIG. 1, the exterior of one illustrative embodiment of a modular edge power system 10 for use in a data center is shown. The modular edge power system 10 includes a cabinet (e.g., a housing) 12. A front side 14, a right side 16, and a top side 18 of the cabinet 12 can be seen in FIG. 1. In the illustrative embodiment, the front side 14 of the cabinet 12 includes a door that may be selectively opened or left off to expose the interior of the cabinet and electrical components mounted therein.

Figure 2:
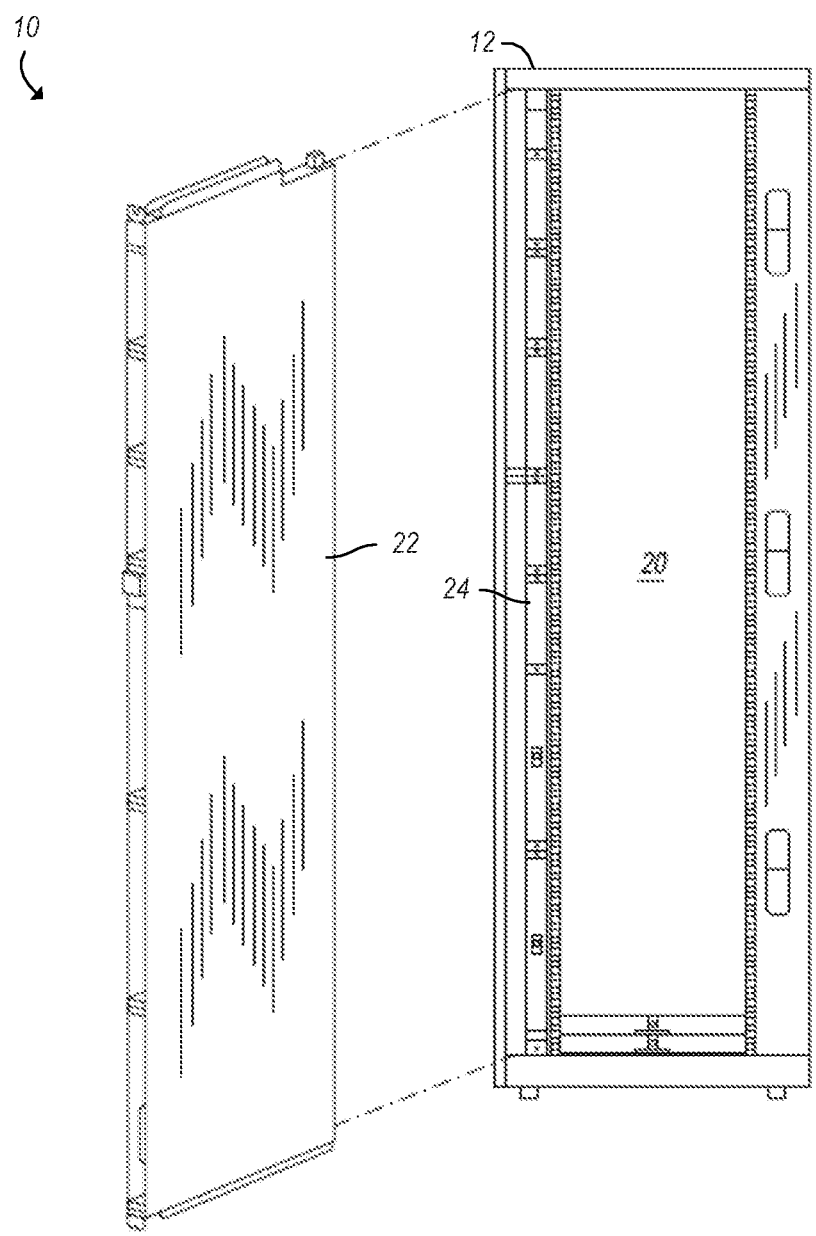
FIG. 2 shows a front plan view of one illustrative embodiment of the interior of the cabinet of FIG. 1.

Referring now to FIG. 2, a front plan view of the interior of the cabinet 12 is shown. A central compartment 20 in the interior of the cabinet 12 is configured to support and house revenue generating equipment (e.g., compute devices). As shown, the modular edge power system 10 illustratively includes two edge modules 22, 24, positioned next to one another along the left side of the cabinet 12, with each edge module 22, 24 spanning most of the interior height of the cabinet from near the top of the cabinet 12 to near the bottom of the cabinet 12. Additional details regarding the edge modules 22, 24 are disclosed in U.S. Provisional Patent Application Ser. No. 62/784,352, filed Dec. 21, 2018, in U.S. patent application Ser. No. 16/553,585, filed Aug. 28, 2019, now published as U.S. Patent Application Publication No. 2020/0205309, and in PCT International Patent Application Serial No. PCT/US2019/066664, filed Dec. 16, 2019, now published as International Publication No. WO 2020/131758 the entire disclosures of which are incorporated herein by reference.

While the modular edge power system 10 is illustrated in the drawings as including two edge modules 22, 24, it is contemplated that other embodiments may include more edge modules (e.g., 3, 4, 5, etc.) or less edge modules (e.g., a single one). Additionally, while the edge modules 22, 24 are illustrated in the drawings as being positioned along the left side of the cabinet, it is contemplated that the edge modules 22, 24 may be positioned in other locations within the cabinet. By way of example, in another illustrative embodiment, the edge modules 22, 24 of the modular edge power system 10 may both be positioned along the right side of the cabinet 12. In still another illustrative embodiment, one (or more) edge modules 22, 24 could be positioned along the left side of the cabinet 12 while another one (or more) of the edge modules 22, 24 could be positioned along the right side of the cabinet 12.

Figure 3A:
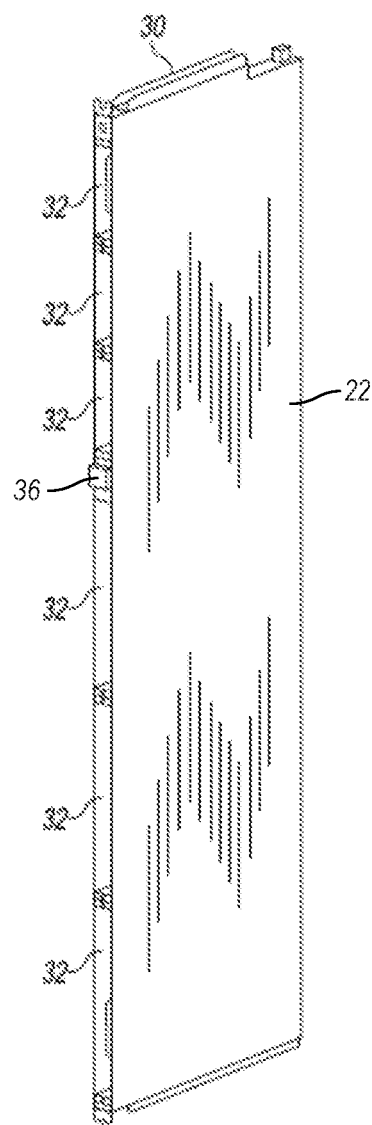
FIG. 3A shows a front perspective view of one illustrative embodiment of an edge module that may be used in the cabinet of FIG. 1.
Figure 3B:
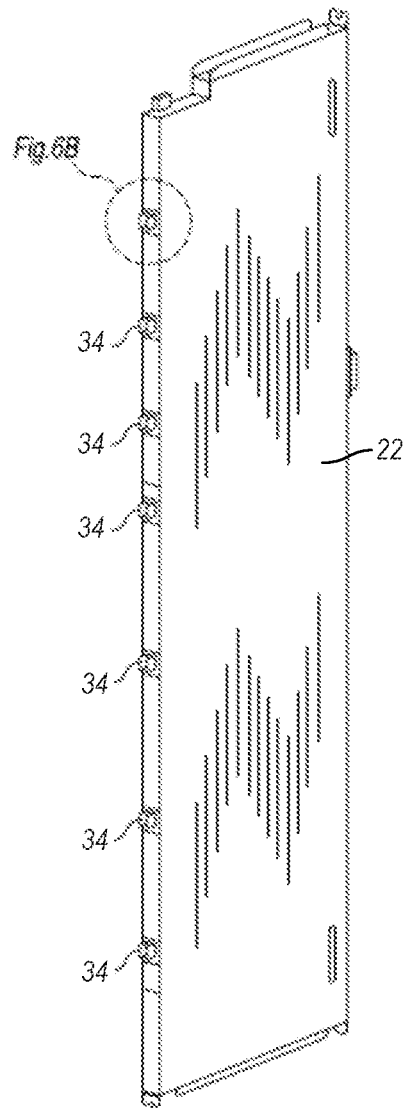
FIG. 3B shows a rear perspective view of the edge module of FIG. 3A.

Referring now to FIGS. 3A-B, front and rear perspective views of one illustrative embodiment of the edge module 22 are shown. The edge module 22 includes upper guide rails 30 positioned along a top side of the edge module 22 to assist in mounting the edge module 22 in the cabinet 12. The edge module 22 similarly includes lower guide rails (not shown) positioned along a bottom side of the edge module 22 to assist in mounting the edge module 22 in the cabinet 12. As shown in FIG. 3A, the front side of the edge module 22 includes a plurality of bays 32 for receiving power equipment submodules (e.g., power electronics), such as rectifier submodules (e.g., each embodied as circuitry configured to convert an alternating current into a direct current and/or other converters, such as DC-DC converters) and battery submodules (e.g., each embodied as a battery configured to store energy and discharge the energy on an as needed basis, such as when power to the modular edge power system 10 is interrupted). As shown in FIG. 3B, the rear side of the edge module includes a plurality of connectors 34 for interfacing with a fixed bus assembly of the modular edge power system 10 (further discussed below). The edge module 22 may also include a power system controller 36, which may perform alarm monitoring and/or other control functions.

Figure 4:
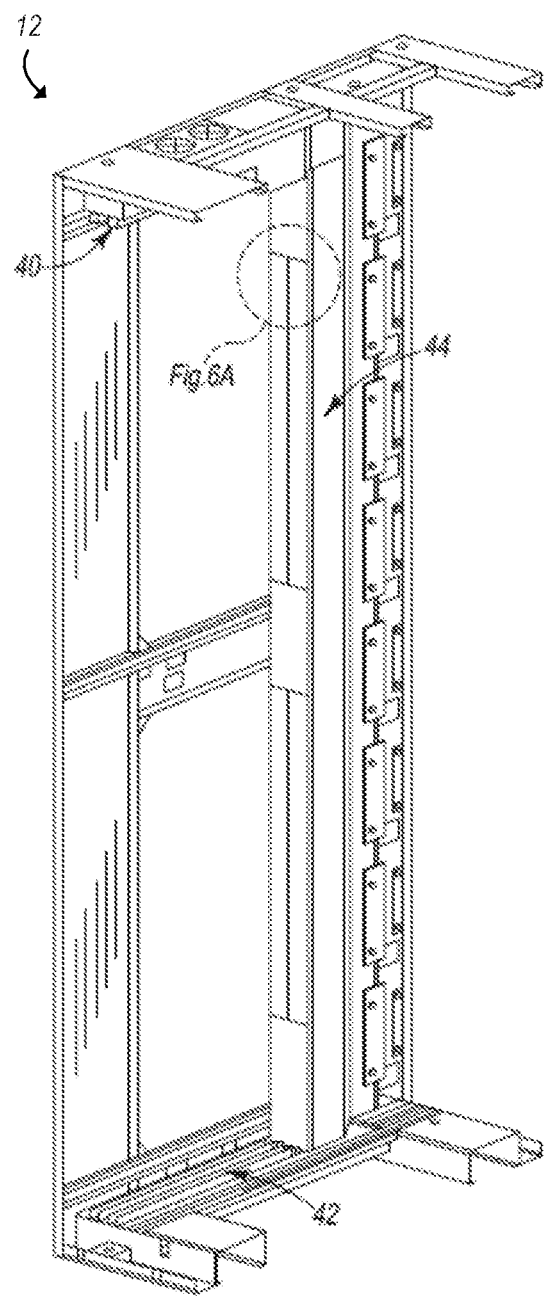
FIG. 4 shows a cross-sectional, perspective view of the interior of the cabinet of FIG. 1, without the edge modules installed.
Figure 5:
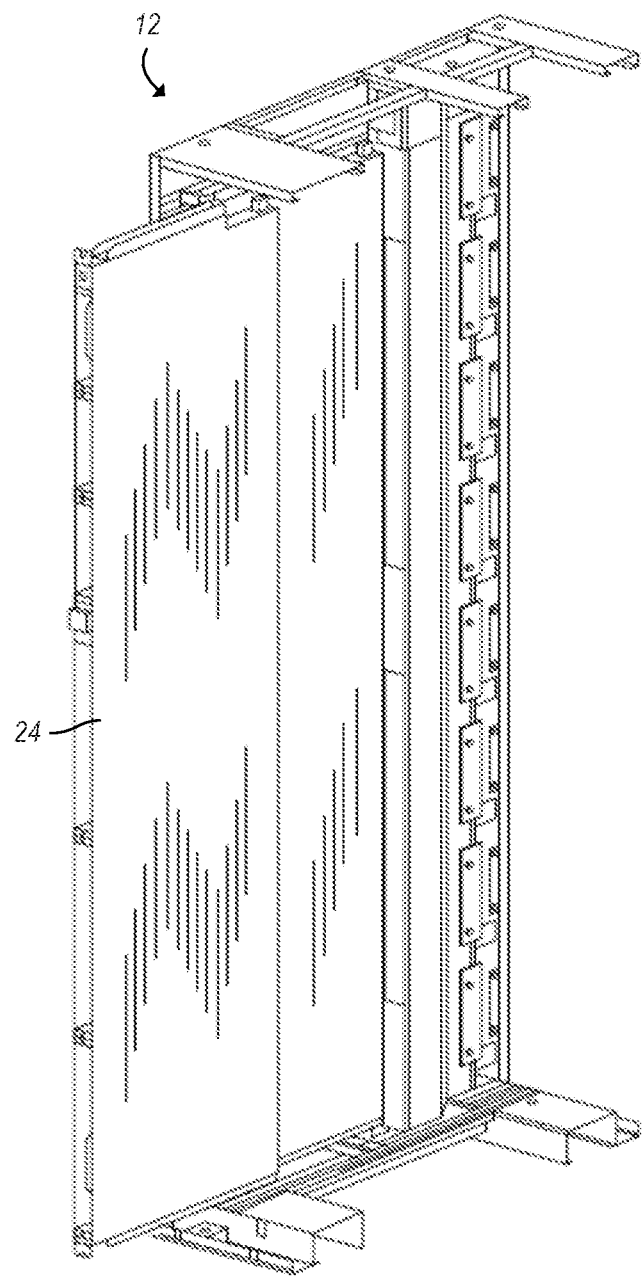
FIG. 5 shows a cross-sectional, perspective view of the interior of the cabinet of FIG. 1, with one edge module installed in the cabinet and another edge module in the process of being installed in (or removed from) the cabinet.

Referring now to FIG. 4, an interior of the cabinet 12 is shown in a cross-sectional, perspective view without any edge modules 22, 24 installed. The cabinet 12 includes upper guide rails 40 that are configured to interface with the upper guide rails 30 of each edge module 22, 24 to assist in mounting the corresponding edge module 22, 24 in the cabinet 12. Similarly, the cabinet 12 includes lower guide rails 42 that are configured to interface with the lower guide rails of each edge module 22, 24 to assist in mounting the corresponding edge module 22, 24 in the cabinet 12. As illustrated in FIG. 5, the edge modules 22, 24 can slide into and out of the cabinet 12 along the guide rails 40, 42. In the illustrative embodiment, the edge modules 22, 24 are designed to be installed/removed from a front side (e.g., the front side 14, shown in FIG. 1) of the cabinet 12. In addition to the edge modules 22, 24, the modular edge power system 10, in the illustrative embodiment, also includes a fixed edge assembly 44 that is positioned near the rear of the cabinet 12. In the illustrative embodiment, the fixed edge assembly 44 is designed to be non-removable during operation of the cabinet 12. As such, the fixed edge assembly 44 only contains components with low failure rates (e.g., copper, sheet metal, wire sets, insulators, etc.) such that a need to repair or replace any components of the fixed edge assembly 44 will be very rare. In the illustrative embodiment, no electronics or printed wire board (PWB) assemblies are included in the fixed edge assembly 44. Rather, such components are included in the easily replaceable edge modules 22, 24.

Figure 6A:
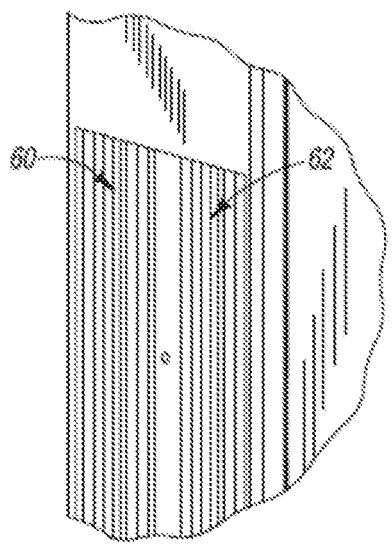
FIG. 6A shows a detailed perspective view of a portion of fixed bus assemblies that are visible in FIG. 4 (one of which is visible in FIG. 5)
Figure 6B:
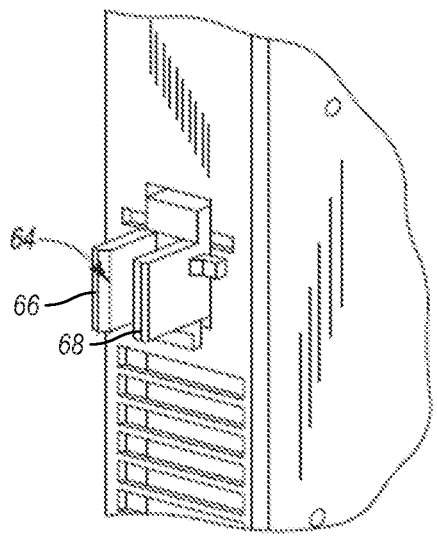
FIG. 6B shows a detailed perspective view of a connector of the edge module of FIG. 3B for interfacing with one of the fixed bus assemblies of FIG. 6A.

Referring now to FIG. 6A, a detailed perspective view of a portion of two fixed bus assemblies 60, 62 of the fixed edge assembly 44 is shown. The fixed bus assemblies 60, 62 each run vertically along a front side of the fixed edge assembly 44 that faces the edge modules 22, 24. The fixed bus assembly 60 is configured to interface with and supply power to a first edge module (e.g., the edge module 22), while the fixed bus assembly 62 is configured to interface with and supply power to a second edge module (e.g., the edge module 24) of the modular edge power system 10. In the illustrative embodiment, each of the fixed bus assemblies 60, 62 is embodied as an Open Compute Project (OCP)-style 48V bus (e.g., a 48V bus bar and a return bus bar, each of which may be silver plated and have tips that are offset from each other by a predefined distance, such as 1.5 mm). FIG. 6B shows a detailed perspective view of a connector 64 located along the rear side of one of the edge modules 22, 24. The connector 64 is configured to interface with and electrically couple to one of the fixed bus assemblies 60, 62 (to receive power therefrom). As such, in the illustrative embodiment, the connector 64 is an OCP style bus connector. The connector 64, in the illustrative embodiment, is configured to be inserted into the fixed bus assembly 60 as one edge module (e.g., the edge module 22) is slid into the cabinet (see FIG. 5) such that conductors 66, 68 in the connector 64 electrically couple to conductors (e.g., the 48V bus bar and the return bus bar) in the fixed bus assembly 60.

Figure 7:
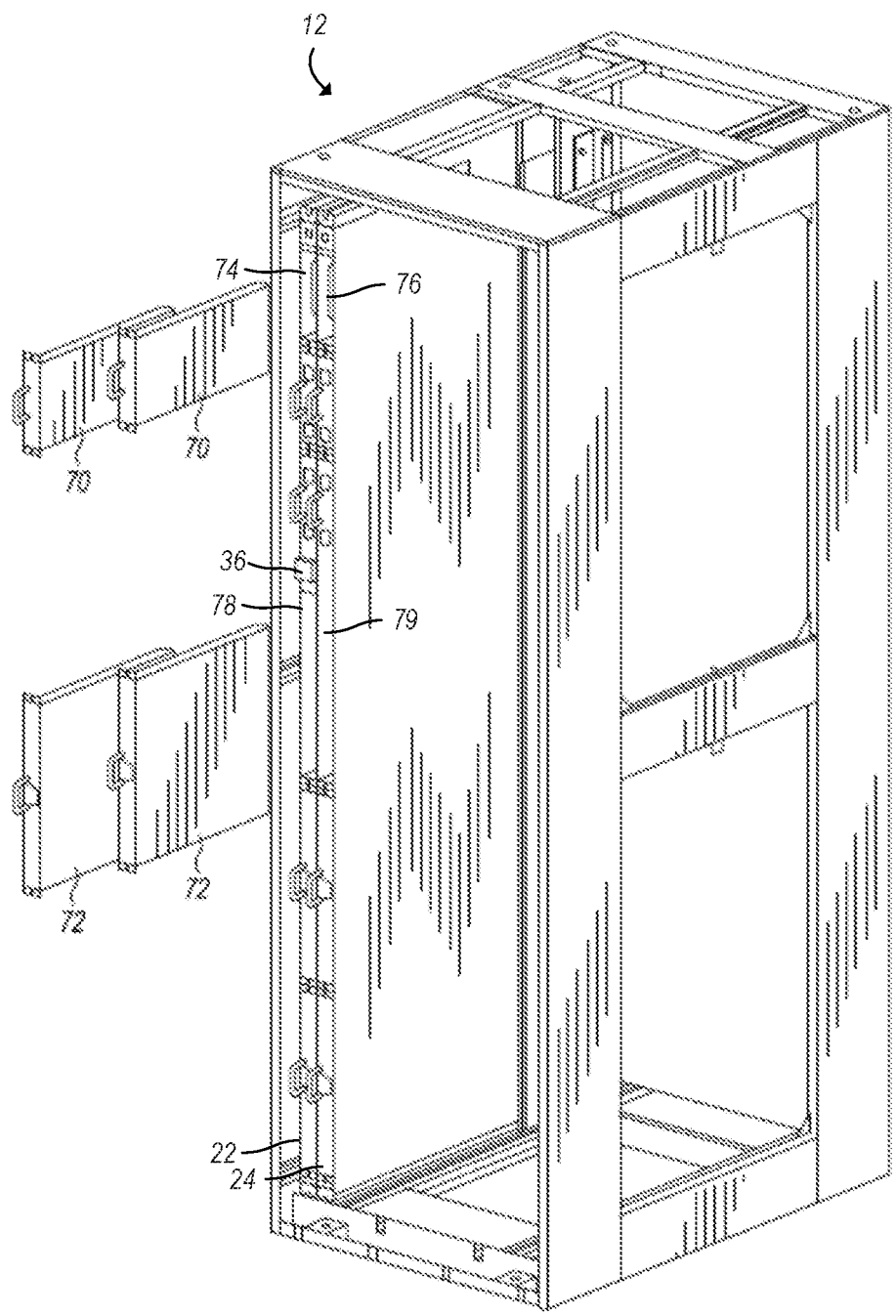
FIG. 7 shows a perspective view of the interior of the cabinet of FIG. 1, with two edge modules installed in the cabinet, illustrating how rectifier submodules and battery submodules may be installed in and removed from the edge modules.

Referring now to FIG. 7, the interior of the cabinet 12 is shown with the two edge modules 22, 24 installed. Two rectifier submodules 70 are shown removed from corresponding bays 74, 76 in the edge modules 22, 24. Similarly, two battery submodules 72 are shown removed from corresponding bays 78, 79 in the edge modules 22, 24. The modularity of the rectifier submodules 70 and the battery submodules 72 allows individual submodules to be easily removed and repaired or replaced in the event that one of these submodules fails, while the system 10 continues to run.

Figure 8:
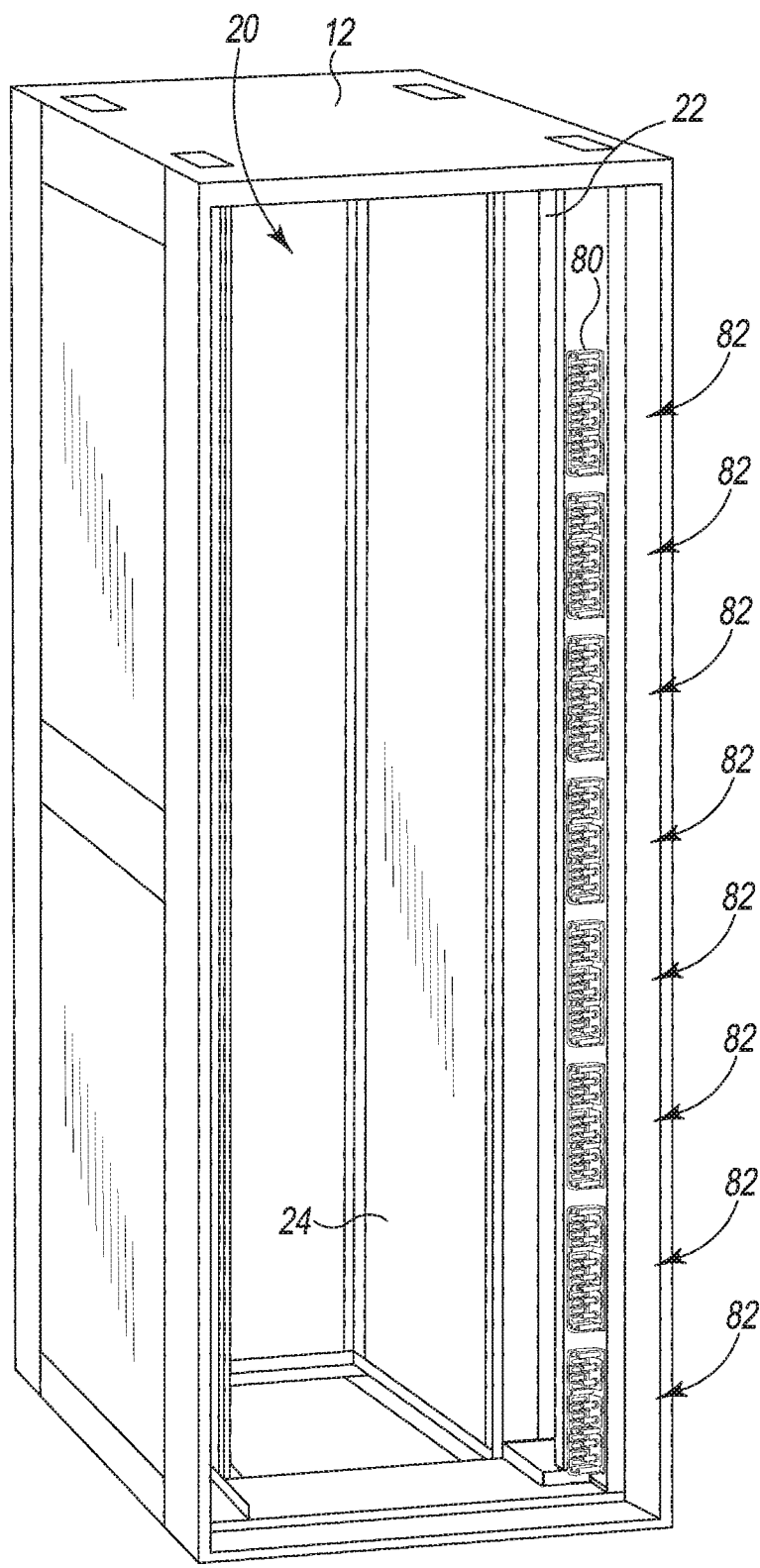
FIG. 8 shows a perspective view of the rear of the cabinet of FIG. 1 without power distribution units installed.

Referring now to FIG. 8, the rear of the cabinet 12 is shown. A DC power bus 80 is positioned toward the rear of the edge modules 22, 24. The DC power bus 80 provides power adjacent to the rack 20 from the top of the cabinet 12 to the bottom of the cabinet 12. Illustratively, the DC power bus 80 is a 48-volt bus; however, it should be understood that in other embodiments the DC power bus 80 may have a different voltage.

Figure 9:
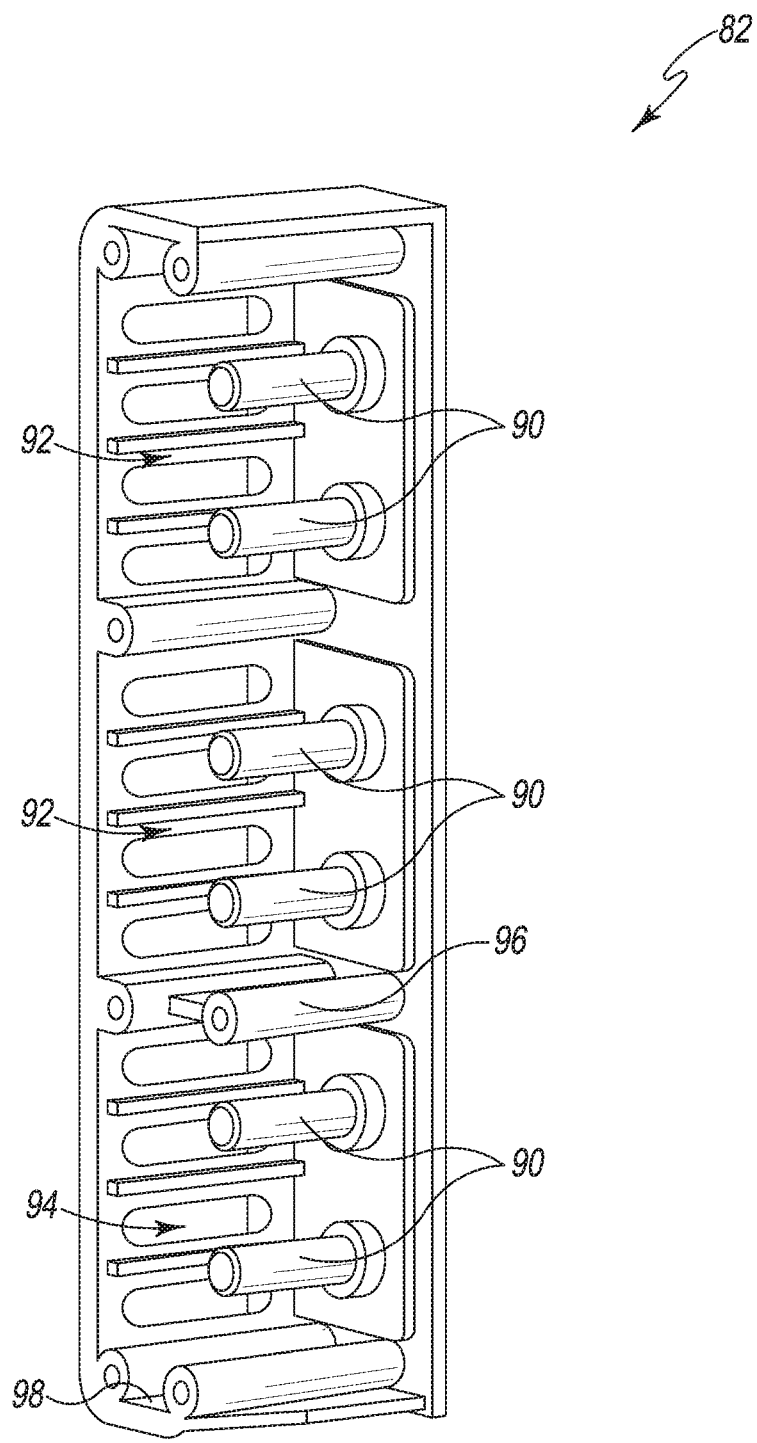
FIG. 9 shows a detailed perspective view of a direct current power bus of the cabinet of FIG. 1.

The DC power bus 80 includes multiple bus segments 82. As best shown in FIG. 9, each bus segment 82 includes multiple power pins 90. Each power pin 90 is a metallic conductor adapted to conduct electrical power from the DC power bus 80. The power pins 90 may be grouped into pairs of pins 90 that are each electrically connected together and thus share an associated polarity. For example, the illustrative bus segment 82 includes two pairs of positive pins 92 (i.e., four positive pins 92 in total) and a pair of common/ground pins 94. Each pair of positive pins 92 may be independently connected to a respective edge module 22, 24, which may provide A/B redundant power. As shown, each bus segment 82 also includes one or more keys 96. The keys 96 are arranged in a predetermined position and orientation relative to the power pins 90. Each DC bus segment 82 also includes a flange 98 that mechanically supports the PDU 100. As described further below, the keys 96 and the flange 98 cooperate to ensure that each power distribution unit can only connect to the power bus 80 in the correct orientation.

Figure 10:
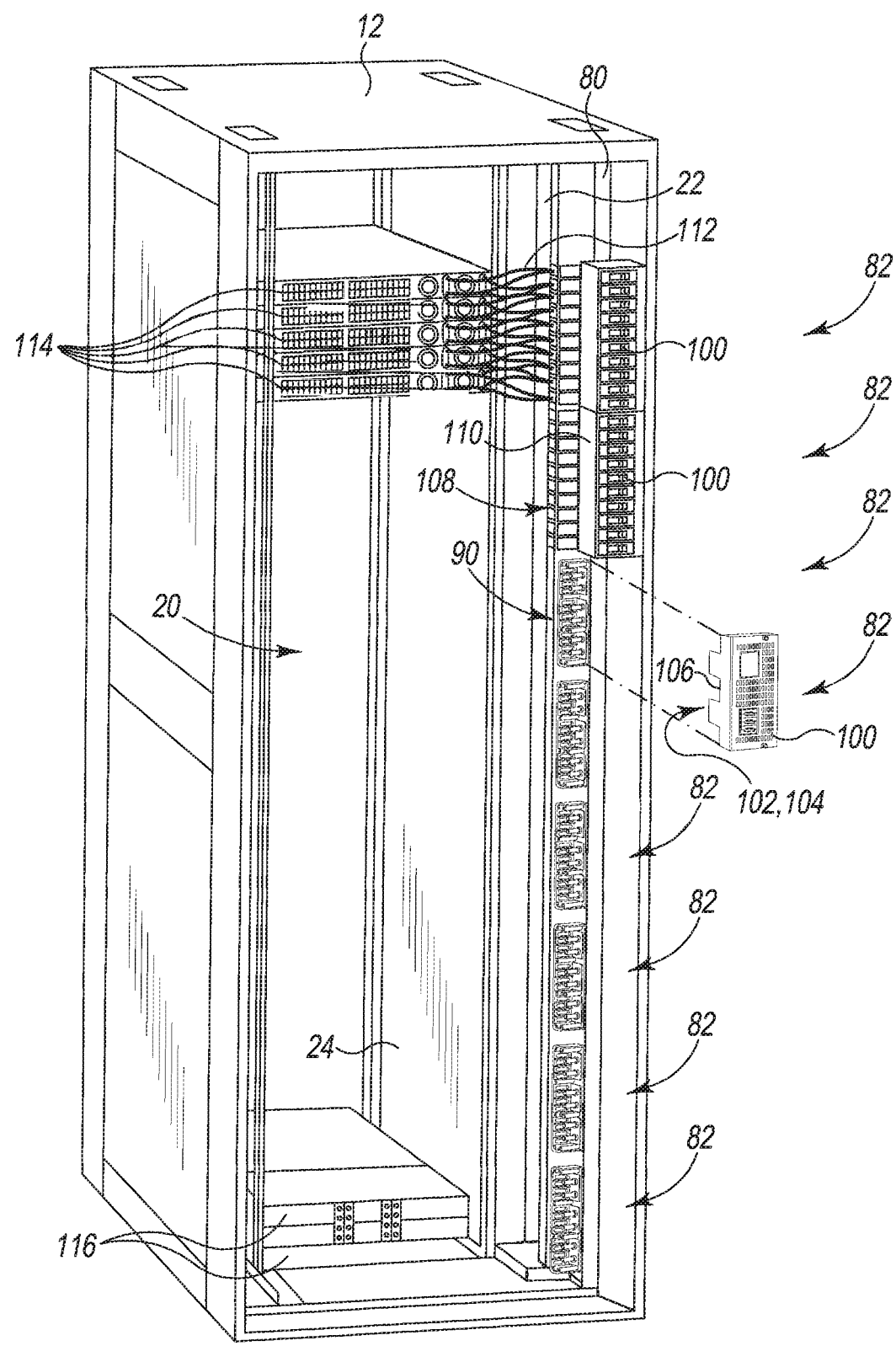
FIG. 10 shows a perspective view of the rear of the cabinet of FIG. 1, with two power distribution units installed in the cabinet, and another power distribution unit in the process of being installed in (or removed from) the cabinet.

Referring now to FIG. 10, multiple power distribution units (PDUs) 100 may be attached to the DC power bus 80. In particular, each PDU 100 may be attached to a corresponding bus segment 82 of the DC power bus 80. Each PDU 100 includes multiple sockets 102 that are adapted to receive the power pins 90 of the DC power bus 80, as well as one or more slots 104 that are adapted to receive the keys 96 of the DC power bus 80. When the PDU 100 is attached to the DC power bus 80, the power pins 90, the keys 96, and/or the flange 98 mechanically support the PDU 100 in position. Additionally, in some embodiments the PDU 100 may be secured to the cabinet 12 with thumbscrews or other fasteners.

As shown in FIG. 10, the sockets 102 are positioned on a side 106 of the PDU 100 that faces the DC power bus 80. Each PDU 100 further includes multiple receptacles 108 positioned on a different side 110 of the PDU 100. Each receptacle 108 is adapted to receive a connectorized cable 112 or otherwise connect to a compute device 114 (or other load equipment). As shown, the compute devices 114 are positioned within the rack 20 of the cabinet 12. Each compute device 114 connects to a PDU 100 that is positioned relatively near the compute device 114 but outside of the rack 20. Illustratively, each compute device 114 connects to two receptacles 108 of the respective PDU 100, which provides A/B redundancy for the compute device 114. For example, each receptacle 108 connected to a particular compute device 114 may draw electrical power from a different pair of positive pins 92 of the DC power bus 80. As described further below, the PDUs 100 distribute electrical power to the connected compute devices 114. In addition to compute devices 114, battery modules 116 or other load equipment may also be positioned within the rack 20. Similar to the compute devices 114, each of the battery modules 116 may also connect to one or two receptacles 108 of a respective PDU 100.

Figure 11:
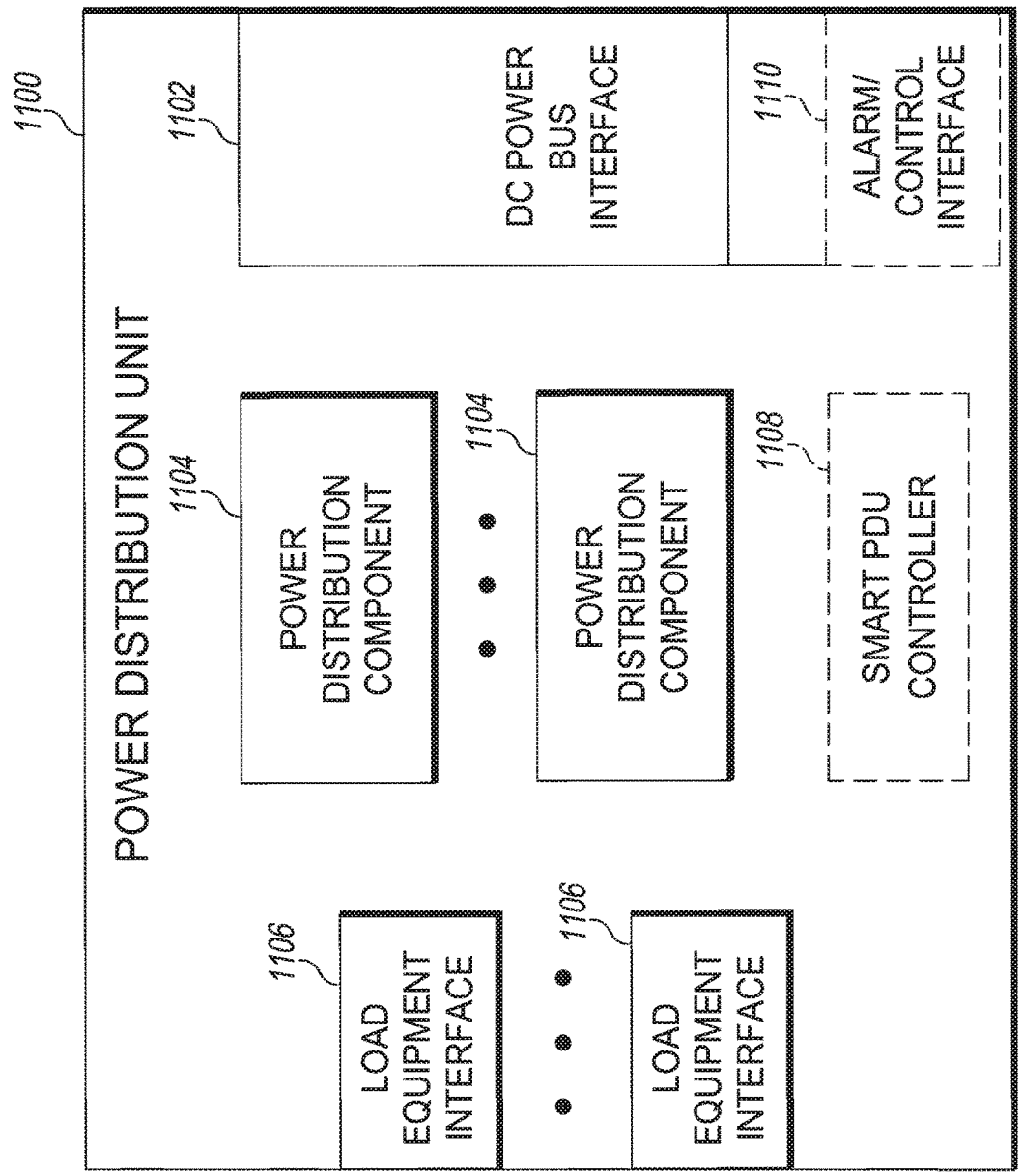
FIG. 11 is a simplified block diagram of at least one embodiment of a power distribution unit that connects to the cabinet of FIG. 1.

Referring now to FIG. 11, an illustrative power distribution unit (PDU) 1100 is shown. Similar to the PDUs 100 of FIG. 10, the PDU 1100 may be configured to connect (e.g., electrically and mechanically) to a rack 20 of compute devices 114 or other load equipment. As shown, the PDU 1100 includes a DC power bus interface 1102, one or more power distribution components 1104, and one or more load equipment interfaces 1106. The DC power bus interface 1102 is configured to connect electrically and mechanically to the DC power bus 80 of the cabinet 12. For example, the DC power bus interface 1102 may include one or more sockets 102 adapted to receive the power pins 90 of the DC power bus 80. Similarly, the DC power bus interface 1102 may include one or more slots 104 adapted to receive the keys 96 of the DC power bus 80. As described above, the sockets 102 and slots 104 cooperate to ensure that the PDU 1100 can only be attached to the DC power bus 80 in the correct orientation.

Similarly, each load equipment interface 1106 is configured to connect electrically to a compute device or other load equipment. In some embodiments, the load equipment interface 1106 may be connectorized, for example by including a receptacle 108 or other connection point adapted to receive a cable or other connector coupled to the load equipment. The PDU 1100 may include multiple redundant load equipment interfaces 1106 for each compute device 114 (e.g., A/B redundancy), and in some embodiments the connection points (e.g., receptacles 108 or other connection points) may be color coded. In some embodiments, the receptacles 108 may also be keyed to ensure that cables are connected in the correct orientation.

Each power distribution component 1104 may be embodied as a DC-DC converter, a DC-AC converter, a circuit breaker, a fuse, or another component configured to distribute power received from the DC power bus interface 1102 to power provided to the load equipment interface 1106. The power distribution components 1104 may also convert input DC power from the DC power bus interface 1102 to a different power level distributed through the load equipment interface 1106. For example, in some embodiments, each power distribution component 1104 may be embodied as a low-current DC-DC converter (e.g., 100 amps at 48 volts). As another example, each power distribution component 1104 may be embodied as a high-current DC-DC converter (e.g., 250 amps at 48 volts). In some embodiments, each power distribution component 1104 may convert the input DC voltage (e.g., 48 volts) to an alternative voltage (e.g., 12 volts or 24 volts). In some embodiments, each power distribution component 1104 may convert the input DC voltage (e.g., 48 volts DC) to AC voltage (e.g., 120 volts AC). In some embodiments, the power distribution components 1104 may be accessible through an exterior housing of the PDU 1100 to facilitate service or replacement.

Figure 12:
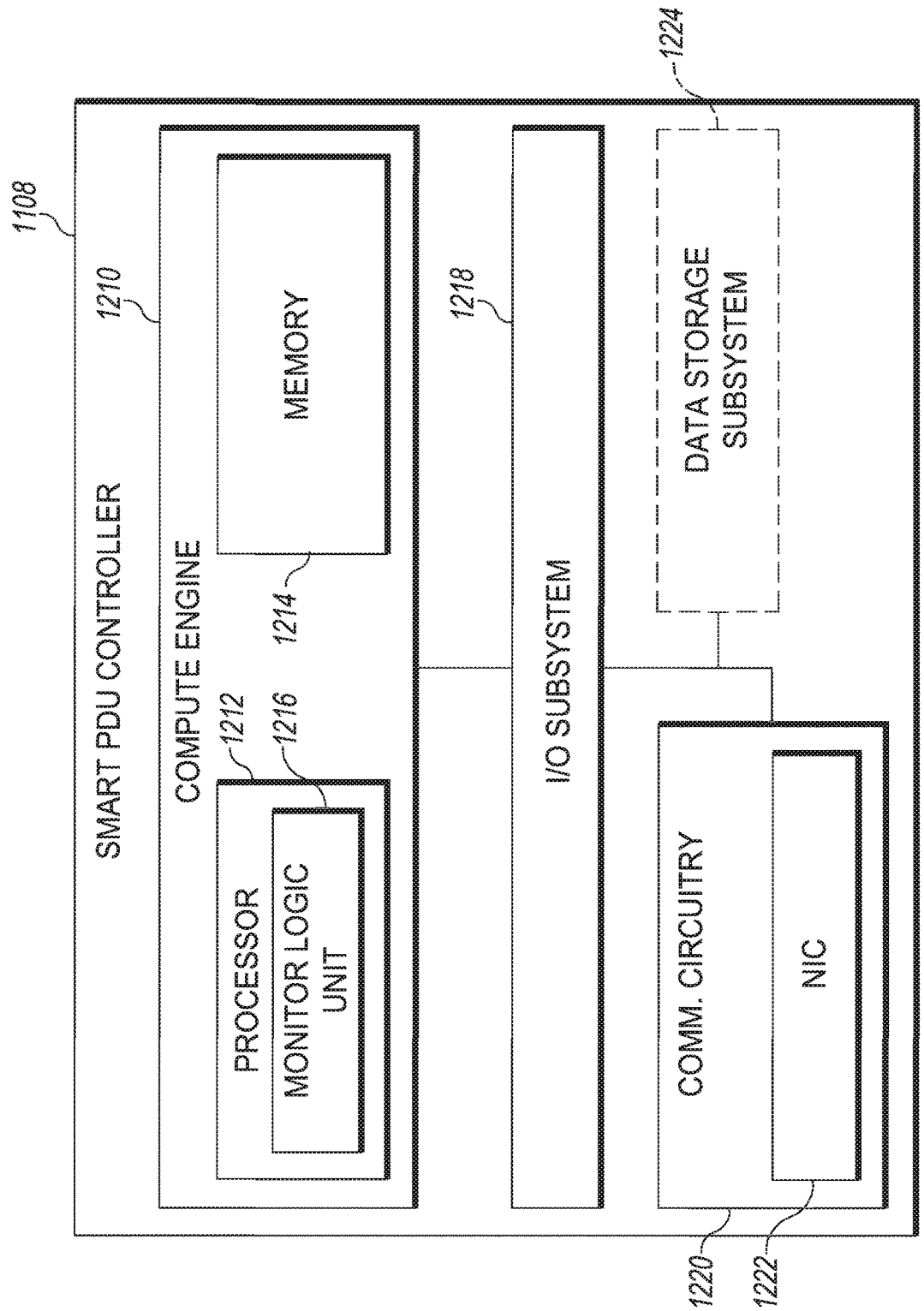
FIG. 12 is a simplified block diagram of at least one embodiment of a smart power distribution unit controller that may be included in the power distribution unit of FIG. 11.

In some embodiments, the PDU 1100 may include a smart PDU controller 1108 and an alarm/control interface 1110. As shown in FIG. 12, the illustrative smart PDU controller 1108 includes a compute engine 1210, an input/output (I/O) subsystem 1218, communication circuitry 1220, and a data storage subsystem 1224. Of course, in other embodiments, the smart PDU controller 1108 may include other or additional components, such as those commonly found in an embedded device (e.g., a display, etc.). Additionally, in some embodiments, one or more of the illustrative components may be incorporated in, or otherwise form a portion of, another component.

The compute engine 1210 may be embodied as any type of device or collection of devices capable of performing various compute functions described below. In some embodiments, the compute engine 1210 may be embodied as a single device such as an integrated circuit, an embedded system, a field-programmable gate array (FPGA), a system-on-a-chip (SOC), or other integrated system or device. Additionally, in some embodiments, the compute engine 1210 includes or is embodied as a processor 1212 and a memory 1214. The processor 1212 may be embodied as any type of processor capable of performing the functions described herein. For example, the processor 1212 may be embodied as a microcontroller, a single or multi-core processor(s), or other processor or processing/controlling circuit. In some embodiments, the processor 1212 may be embodied as, include, or be coupled to an FPGA, an application specific integrated circuit (ASIC), reconfigurable hardware or hardware circuitry, or other specialized hardware to facilitate performance of the functions described herein.

The main memory 1214 may be embodied as any type of volatile (e.g., dynamic random access memory (DRAM), etc.) or non-volatile memory or data storage capable of performing the functions described herein. Volatile memory may be a storage medium that requires power to maintain the state of data stored by the medium. In some embodiments, all or a portion of the main memory 1214 may be integrated into the processor 1212. In operation, the main memory 1214 may store various software and data used during operation, such as data indicative of the status of the power distribution components 1104 of the PDU 1100, applications, programs, libraries, and drivers.

The compute engine 1210 is communicatively coupled to other components of the smart PDU controller 1108 via the I/O subsystem 1218, which may be embodied as circuitry and/or components to facilitate input/output operations with the compute engine 1210 (e.g., with the processor 1212, the main memory 1214, etc.) and other components of the PDU 1100 (e.g., any installed power distribution components 1104). For example, the I/O subsystem 1218 may be embodied as, or otherwise include, memory controller hubs, input/output control hubs, integrated sensor hubs, firmware devices, communication links (e.g., point-to-point links, bus links (e.g., Open Compute Project buses), wires, cables, light guides, printed circuit board traces, etc.), and/or other components and subsystems to facilitate the input/output operations. In some embodiments, the I/O subsystem 1218 may form a portion of a system-on-a-chip (SoC) and be incorporated, along with one or more of the processor 1212, the main memory 1214, and other components of the smart PDU controller 1108, into the compute engine 1210.

The communication circuitry 1220 may be embodied as any communication circuit, device, or collection thereof, capable of enabling communications over a network between the smart PDU controller 1108 and another device (e.g., a management compute device in a building management system, one or more compute devices in a rack, etc). The communication circuitry 1220 may be configured to use any one or more communication technology (e.g., wired or wireless communications) and associated protocols (e.g., Ethernet, RS485, Modbus, SNMP, Bluetooth®, WiMAX, etc.) to effect such communication. In some embodiments, the communication circuitry 1220 may communicate with one or more power system controllers 36 of the cabinet 12 via the alarm/control interface 1110 of the PDU 1100.

The illustrative communication circuitry 1220 includes a network interface controller (NIC) 1122. The NIC 1222 may be embodied as one or more add-in-boards, daughter cards, network interface cards, controller chips, chipsets, or other devices that may be used by the modular edge power system 1200 to connect with another device. In some embodiments, the NIC 1222 may be embodied as part of a system-on-a-chip (SoC) that includes one or more processors, or included on a multichip package that also contains one or more processors. In some embodiments, the NIC 1222 may include a local processor (not shown) and/or a local memory (not shown) that are both local to the NIC 1222. In such embodiments, the local processor of the NIC 1222 may be capable of performing one or more of the functions of the processor 1212. Additionally or alternatively, in such embodiments, the local memory of the NIC 1222 may be integrated into one or more components of the smart PDU controller 1108 at the board level, socket level, chip level, and/or other levels.

The data storage subsystem 1224 may be embodied as any type of devices configured for short-term or long-term storage of data such as, for example, memory devices and circuits, memory cards, hard disk drives, solid-state drives, or other data storage devices. In the illustrative embodiment, the data storage subsystem includes data collected from the power distribution components 1104 (e.g., operational status data), such as voltages, currents, temperatures, individual protector status, alarm status, and other status information.

Figure 13:
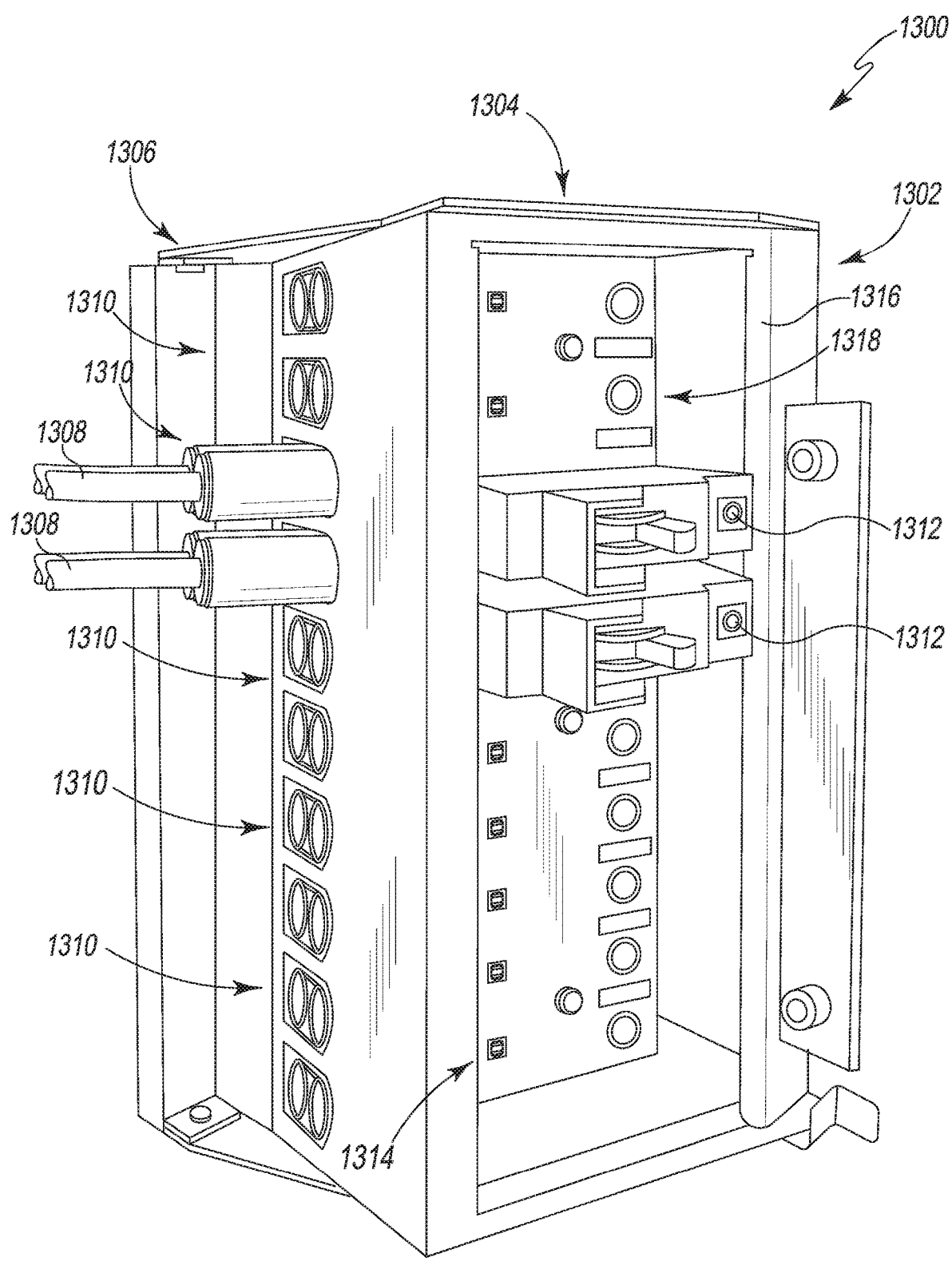
FIGS. 13-16 each show a perspective view of at least one embodiment of a power distribution unit of FIG. 11.

Referring now to FIG. 13, a PDU 1300, similar to the PDUs 100, 1100 is shown. As shown, the PDU 1300 includes a DC power bus interface 1302, multiple power distribution components 1304, and multiple load equipment interfaces 1306. Illustratively, the PDU 1300 includes 10 load equipment interfaces 1306 that are each configured to receive a connectorized cable 1308 that may be coupled to a compute device 114 or other load equipment (not shown in FIG. 13). Each load equipment interface 1306 illustratively provides up to 100 amps of DC power at 48 volts. The load equipment interfaces 1306 are arranged in five color-coded pairs 1310. Each pair 1310 of load equipment interfaces 1306 may be connected to a single compute device, thereby providing A/B redundancy to that compute device. Accordingly, the PDU 1300 may be coupled to five compute devices or other load equipment and provide A/B redundancy.

As shown, the power distribution components 1304 include multiple circuit breakers 1312. The circuit breakers 1312 are accessible through an opening 1314 defined in a housing 1316 of the PDU 1300. Each circuit breaker 1312 may be connected to the other power distribution components 1304 via a socket 1318. Thus, the circuit breakers 1312 may be serviced and/or replaced without disconnecting the PDU 1300 from the power bus interface 1302 or from the load equipment interfaces 1306.

Figure 14:
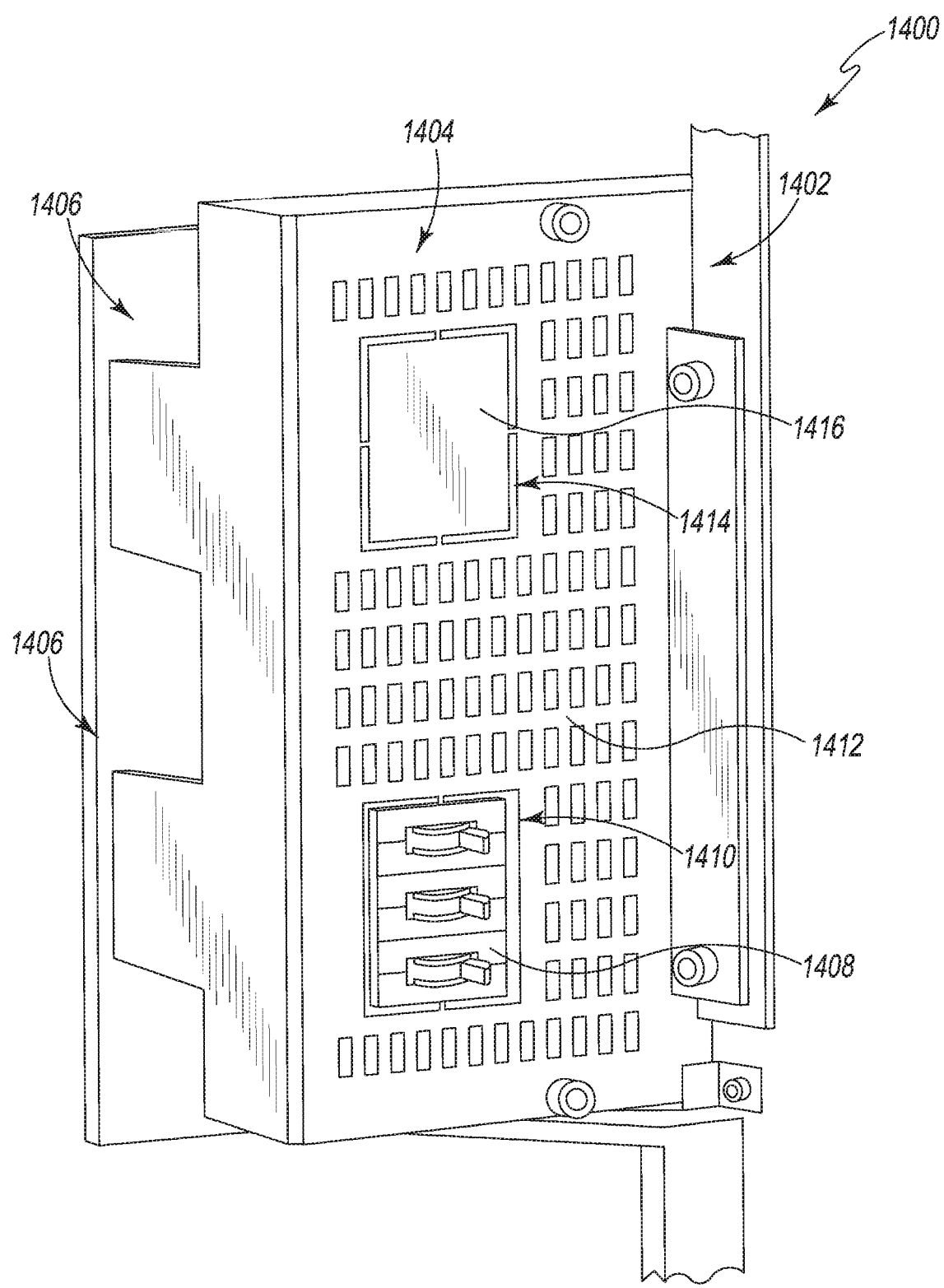

Referring now to FIG. 14, a PDU 1400, similar to the PDUs 100, 1100, 1300 is shown. As shown, the PDU 1400 includes a DC power bus interface 1402, multiple power distribution components 1404, and multiple load equipment interfaces 1406. Illustratively, the PDU 1400 includes 2 load equipment interfaces 1406 that are each configured to connect to a compute device 114 or other load equipment (not shown in FIG. 14). Each load equipment interface 1406 illustratively provides up to 300 amps of DC power at 48 volts. Thus, the load equipment interfaces 1406 may each include electrical lugs, terminals, and other components suitable for crimping or otherwise connecting cables that carry higher current electrical loads. Both of the load equipment interfaces 1406 may be connected to a single compute device 114, thereby providing A/B redundancy to that compute device 114. Accordingly, the PDU 1400 may be coupled to one compute device 114 or other load equipment and provide A/B redundancy.

As shown, the power distribution components 1404 include a circuit breaker 1408. The circuit breaker 1408 is accessible through an opening 1410 defined in a housing 1412 of the PDU 1400. The circuit breaker 1408 may be connected to the other power distribution components 1404 via a socket or other replaceable connector. Thus, the circuit breaker 1408 may be serviced and/or replaced without disconnecting the PDU 1400 from the power bus interface 1402 or from the load equipment interfaces 1406. As shown, the PDU 1400 includes a second opening 1414 in the housing 1412 protected by a break-off cover 1416. It should be understood that in some embodiments, the cover 1416 may be removed and another circuit breaker 1408 may be installed in the second opening 1414.

Figure 15:
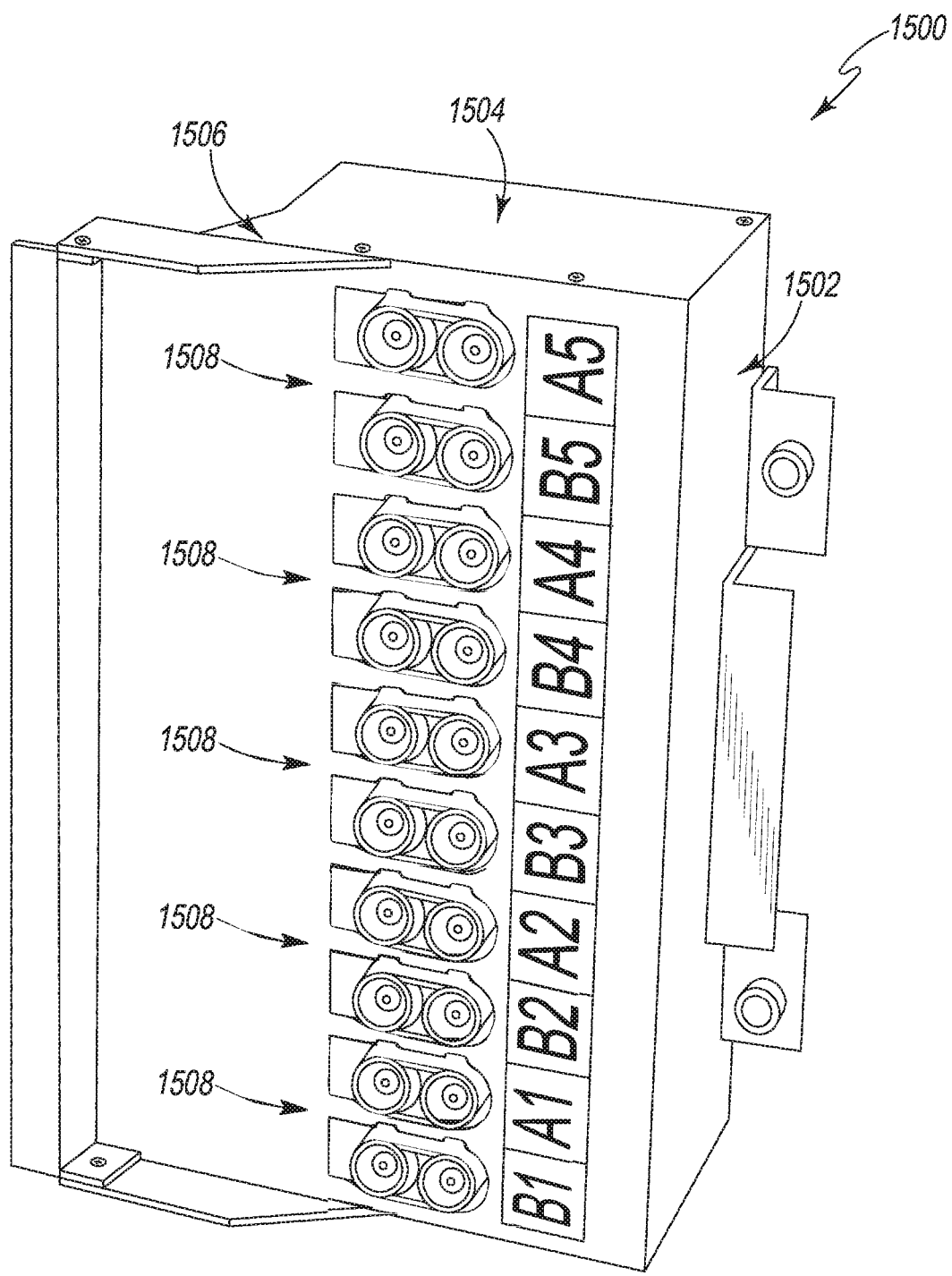

Referring now to FIG. 15, a PDU 1500, similar to the PDUs 100, 1100, 1300 is shown. As shown, the PDU 1500 includes a DC power bus interface 1502, power distribution components 1504, and multiple load equipment interfaces 1506. Illustratively, the PDU 1500 includes 10 load equipment or battery module interfaces 1506 that are each configured to receive a connectorized cable that may be coupled to a compute device, a battery module, or other load equipment (not shown in FIG. 15). Each load equipment interface 1506 illustratively provides up to 100 amps of DC power at 48 volts. In some embodiments, each load equipment interface 1506 may provide a higher amount of current for limited durations (e.g., supplying up to 200 amps of DC power at 48 volts for less than five minutes). The load equipment interfaces 1506 are arranged in five color-coded pairs 1508. Each pair 1508 of load equipment interfaces 1506 may be connected to a single device, thereby providing A/B redundancy to that device. For example, a pair 1508 of load equipment interfaces 1506 may provide A/B optional battery reserve backup when connected to a battery module. Accordingly, the PDU 1500 may be coupled to five compute devices or other load equipment and provide A/B redundancy. Unlike the PDU 1300 shown in FIG. 13, the PDU 1500 does not include circuit breakers. Thus, the PDU 1300 may be appropriate for load equipment that should not be connected to a circuit breaker, such as battery modules or similar load equipment.

Figure 16:
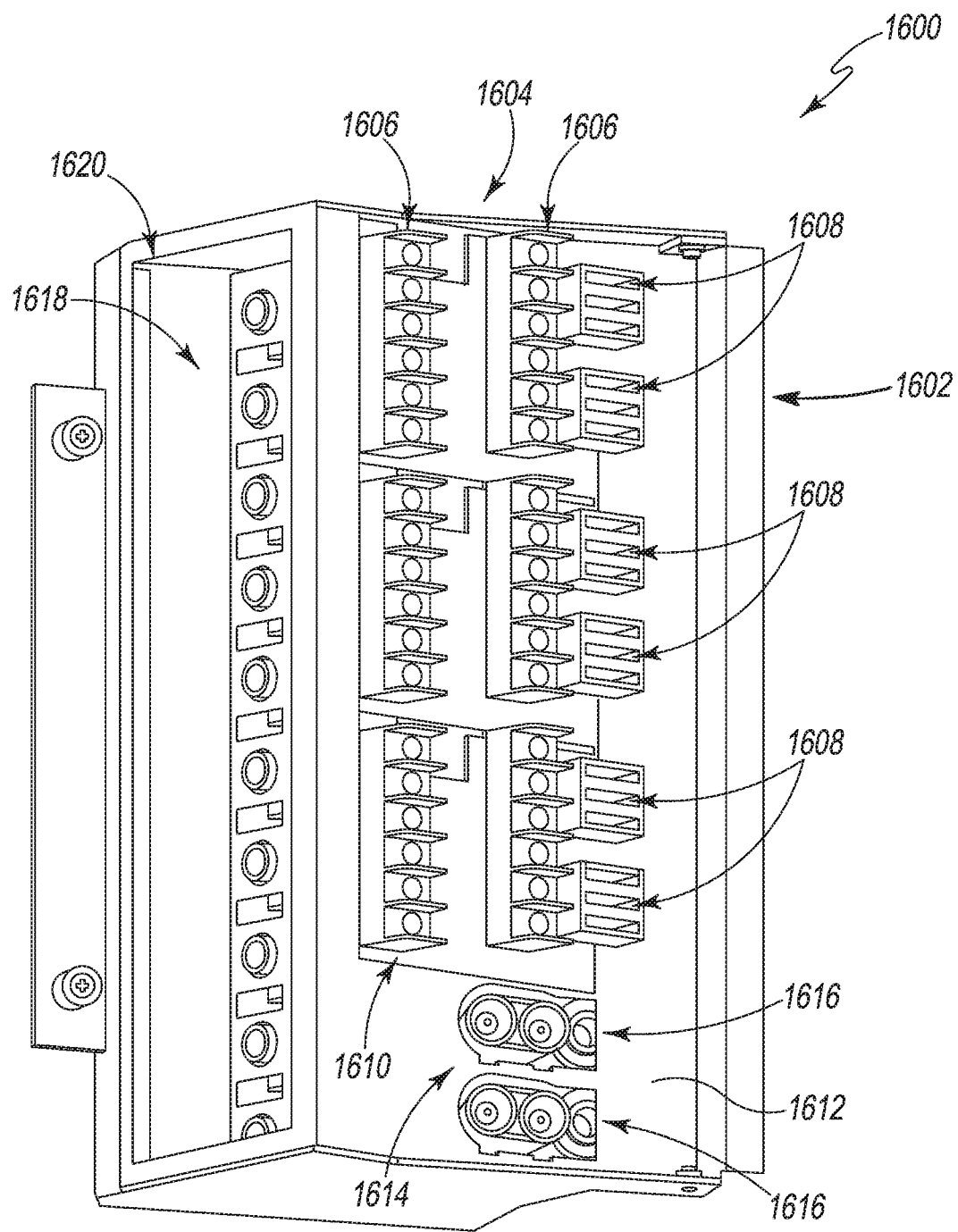

Referring now to FIG. 16, a PDU 1600, similar to the PDUs 100, 1100, 1300 is shown. As shown, the PDU 1600 includes a DC power bus interface 1602, multiple power distribution components 1604, and multiple load equipment interfaces 1606. Illustratively, the PDU 1600 includes 18 load equipment interfaces 1606 that are each embodied as terminal blocks for fused load connections. Each load equipment interface 1606 illustratively provides low-current DC power at 48 volts (e.g., 5 amps, 10 amps, or other relatively low amount of current).

As shown, the power distribution components 1604 include multiple fuse blocks 1608. The fuse blocks 1608 are accessible through an opening 1610 defined in a housing 1612 of the PDU 1300. Each fuse block 1608 is configured to receive multiple GMT fuses or other small-sized fuses. The fuses may provide overcurrent protection for low-current load equipment connected to the load equipment interfaces 1606, such as electronic devices. As the fuse blocks 1608 are accessible through the opening 1610, individual fuses may be serviced and/or replaced without disconnecting the PDU 1600 from the power bus interface 1602 or from the load equipment interfaces 1606.

The illustrative PDU 1600 further includes a pair 1614 of connectorized load equipment interfaces 1616. Each connectorized interface 1616 illustratively provides up to 100 amps of DC power at 48 volts. Similar to the pairs 1310 of connectorized interfaces 1306 of FIG. 13, the pair 1614 of interfaces 1616 may be connected to a single compute device, thereby providing A/B redundancy to that compute device.

As shown in FIG. 16, the PDU 1600 further includes multiple sockets 1618 that are accessible through an opening 1620 defined in the housing 1612. Each of the sockets 1618 may receive a circuit breaker, a shorting strap, or other power distribution component 1604. Thus, the power distribution components 1604 may be serviced and/or replaced without disconnecting the PDU 1600 from the power bus interface 1602 or from the load equipment interfaces 1606, 1616.

While certain illustrative embodiments have been described in detail in the drawings and the foregoing description, such an illustration and description is to be considered as exemplary and not restrictive in character, it being understood that only illustrative embodiments have been shown and described and that all changes and modifications that come within the spirit of the disclosure are desired to be protected. There exist a plurality of advantages of the present disclosure arising from the various features of the apparatus, systems, and methods described herein. It will be noted that alternative embodiments of the apparatus, systems, and methods of the present disclosure may not include all of the features described, yet still benefit from at least some of the advantages of such features. Those of ordinary skill in the art may readily devise their own implementations of the apparatus, systems, and methods that incorporate one or more of the features of the present disclosure.

The invention claimed is:

1. A power distribution unit comprising:
   a bus interface adapted to be removably connected to a direct current power bus, the bus interface comprising a plurality of sockets, wherein each of the sockets is adapted to receive a power pin of the direct current power bus;
   a load equipment interface adapted to be removably connected to a plurality of compute devices in a rack; and
   a power distribution circuit coupled to the bus interface and the load equipment interface, wherein the power distribution circuit is configured to distribute a first electrical power level received from the direct current power bus via the bus interface to a second electrical power level delivered to the plurality of compute devices via the load equipment interface.

2. The power distribution unit of claim 1, wherein the first electrical power level comprises 48 volts direct current.

3. The power distribution unit of claim 1, wherein the power distribution circuit is further configured to convert the first electrical power level to the second electrical power level, wherein the first electrical power level comprises direct current at a first voltage and the second electrical power level comprises direct current at a second voltage, wherein the second voltage is lower than the first voltage.

4. The power distribution unit of claim 3, wherein the first voltage comprises 48 volts direct current and the second voltage comprises 12 volts direct current or 24 volts direct current.

5. The power distribution unit of claim 1, wherein the second electrical power level comprises 100 amperes per compute device.

6. The power distribution unit of claim 1, wherein the second electrical power level comprises 250 amperes per compute device.

7. The power distribution unit of claim 1, wherein the power distribution circuit is further configured to convert the first electrical power level to the second electrical power level, wherein the first electrical power level comprises direct current and the second electrical power level comprises alternating current.

8. The power distribution unit of claim 1, wherein the bus interface further comprises a slot adapted to receive a key of the direct current power bus, wherein the key is located in a predetermined position with a predetermined orientation relative to the plurality of sockets.

9. The power distribution unit of claim 1, wherein the load equipment interface comprises a plurality of connector receptacles, wherein each of the connector receptacles is adapted to receive a connector coupled to a compute device of the plurality of compute devices.

10. The power distribution unit of claim 1, wherein the power distribution unit comprises a housing, and wherein the bus interface is positioned on a first side of the housing and the load equipment interface is positioned on a second side of the housing.

11. The power distribution unit of claim 10, wherein the power distribution circuit comprises a circuit breaker accessible through an opening in the housing.

12. A modular edge power system comprising:
a cabinet housing;
a rack inside of the cabinet housing, wherein the rack is adapted to mount a plurality of compute devices;
a direct current power bus within the cabinet housing; and
a power distribution unit removably coupled to the direct current power bus and removably coupled to one or more of the compute devices in the rack, wherein the power distribution unit is configured to convert a first electrical power level received from the direct current power bus to a second electrical power level delivered to the one or more of the compute devices, and wherein the power distribution unit is positioned within the cabinet housing and outside of the rack.

13. The modular edge power system of claim 12, wherein:
the direct current power bus comprises a plurality of power pins; and
the power distribution unit comprises a plurality of sockets, wherein each of the sockets is adapted to receive a power pin of the direct current power bus.

14. The modular edge power system of claim 13, wherein:
the plurality of power pins comprises a first group of positive pins, a second group of positive pins, and a third group of common pins, wherein the second group of positive pins is redundant to the first group of positive pins; and
the plurality of sockets comprises a first group of sockets, a second group of sockets, and a third group of sockets, wherein each of the sockets of the first group of sockets is adapted to receive a respective power pin of the first group of positive pins, each of the sockets of the second group of sockets is adapted to receive a respective power pin of the second group of positive pins, and each of the sockets of the third group of sockets is adapted to receive a respective power pin of the third group of common pins.

15. The modular edge power system of claim 12, wherein:
the direct current power bus comprises a key located in a predetermined position with a predetermined orientation relative to the plurality of power pins; and
the power distribution unit comprises a slot adapted to receive the key of the direct current power bus.

16. The modular edge power system of claim 12, wherein the power distribution unit comprises a plurality of power distribution units removably coupled to the direct current power bus, wherein each of the power distribution units is removably coupled to a different one of the compute devices in the rack, and wherein each of the power distribution units is configured to convert the first electrical power level to the second electrical power level that is associated with the different one of the compute devices.

17. The modular edge power system of claim 12, further comprising an edge module adapted to be removably inserted into the cabinet housing outside of the rack, and to provide the first electrical power level to the direct current power bus, wherein the edge module comprises a rectifier submodule and a battery submodule.

* * * * *